(12) United States Patent
Prost et al.

(10) Patent No.: US 11,329,455 B2
(45) Date of Patent: May 10, 2022

(54) GERMANIUM-ON-SILICON LASER IN CMOS TECHNOLOGY

(71) Applicant: STMicroelectronics (Crolles 2) SAS, Crolles (FR)

(72) Inventors: Mathias Prost, Tremblay-En-Franc (FR); Moustafa El Kurdi, Cachan (FR); Philippe Boucaud, Paris (FR); Frederic Boeuf, Le Versoud (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/867,666

(22) Filed: May 6, 2020

(65) Prior Publication Data

US 2020/0266609 A1    Aug. 20, 2020

Related U.S. Application Data

(62) Division of application No. 15/555,639, filed as application No. PCT/FR2015/050555 on Mar. 6, 2015, now Pat. No. 10,686,297.

(51) Int. Cl.
*H01S 5/227* (2006.01)
*H01S 5/32* (2006.01)
(Continued)

(52) U.S. Cl.
CPC ............ *H01S 5/3223* (2013.01); *H01S 5/021* (2013.01); *H01S 5/0424* (2013.01); *H01S 5/1003* (2013.01); *H01S 5/2275* (2013.01); *H01S 5/3086* (2013.01); *H01S 5/3202* (2013.01); *G02B 6/10* (2013.01); *G02B 6/136* (2013.01);
(Continued)

(58) Field of Classification Search
CPC ............ H01S 5/021; H01S 5/22–2228; H01S 5/3223; H01S 5/3027; H01S 5/3202; H01S 5/3086; H01S 5/2275; H01S 5/0424; H01S 5/2201; H01S 5/1003; G02B 6/10; G02B 6/136; G02B 2006/12061;
(Continued)

(56) References Cited

U.S. PATENT DOCUMENTS

| | | | |
|---|---|---|---|
| 5,841,930 A | 11/1998 | Kovacic et al. | |
| 7,777,250 B2 | 8/2010 | Lochtefeld | |

(Continued)

FOREIGN PATENT DOCUMENTS

| | | | |
|---|---|---|---|
| CN | 103427332 | * 12/2013 | ............... H01S 5/22 |
| CN | 103427332 A | 12/2013 | |

(Continued)

OTHER PUBLICATIONS

First Office Action and Search Report from co-pending CN Appl. No. 201580078947.7 dated Feb. 1, 2019 (11 pages).

(Continued)

*Primary Examiner* — Xinning(Tom) Niu
*Assistant Examiner* — Delma R Fordé
(74) *Attorney, Agent, or Firm* — Crowe & Dunlevy

(57) ABSTRACT

A germanium waveguide is formed from a P-type silicon substrate that is coated with a heavily-doped N-type germanium layer and a first N-type doped silicon layer. Trenches are etched into the silicon substrate to form a stack of a substrate strip, a germanium strip, and a first silicon strip. This structure is then coated with a silicon nitride layer.

16 Claims, 4 Drawing Sheets

(51) Int. Cl.
*H01S 5/02* (2006.01)
*H01S 5/042* (2006.01)
*H01S 5/30* (2006.01)
*H01S 5/10* (2021.01)
*G02B 6/136* (2006.01)
*G02B 6/12* (2006.01)
*G02B 6/10* (2006.01)

(52) U.S. Cl.
CPC .......... *G02B 2006/121* (2013.01); *G02B 2006/12061* (2013.01); *G02B 2006/12121* (2013.01); *G02B 2006/12128* (2013.01); *G02B 2006/12176* (2013.01)

(58) Field of Classification Search
CPC .... G02B 2006/121; G02B 2006/12121; G02B 2006/12128; G02B 2006/12176
See application file for complete search history.

(56) References Cited

U.S. PATENT DOCUMENTS

| | | | |
|---|---|---|---|
| 9,530,887 | B1 | 12/2016 | Chang et al. |
| 2006/0079056 | A1 | 4/2006 | Kim et al. |
| 2007/0105251 | A1 | 5/2007 | Liu et al. |
| 2009/0039361 | A1 | 2/2009 | Liu et al. |
| 2009/0130826 | A1 | 5/2009 | Kim et al. |
| 2010/0074291 | A1 | 3/2010 | Nakamura |
| 2010/0213477 | A1 | 8/2010 | Xu et al. |
| 2012/0287959 | A1 | 11/2012 | Tani et al. |
| 2013/0202005 | A1 | 8/2013 | Dutt |
| 2014/0254620 | A1 | 9/2014 | Bessette et al. |
| 2017/0141228 | A1 | 5/2017 | Hsu et al. |
| 2017/0294762 | A1* | 10/2017 | Kim ............ H01S 5/021 |

FOREIGN PATENT DOCUMENTS

| | | |
|---|---|---|
| CN | 104752341 A | 7/2015 |
| EP | 0673061 A1 | 9/1995 |
| JP | S60113982 A | 6/1985 |
| JP | 2000183155 A | 6/2000 |
| JP | 2004170608 A | 6/2004 |
| TW | 201338020 A | 9/2013 |

OTHER PUBLICATIONS

Second Office Action from co-pending CN Appl. No. 201580078947.7 dated Oct. 8, 2019 (12 pages).

International Search Report and Written Opinion for PCT/FR2015/050555 dated Jan. 12, 2016 (17 pages).

English Translation of International Preliminary Examination Report for PCT/FR2015/050555 dated Sep. 21, 2017 (10 pages).

Camacho-Aguilera, Rodolfo E., et al: "An Electrically Pumped Germanium Laser," vol. 20, No. 10 / Optics Express 11318, May 7, 2012 (5 pages).

Tani, Kazuki et al: "Germanium Waveguides on Lateral Silicon-on-Insulator Diodes for Monolithic Light Emitters and Photo Detectors," 10th International Conference on Group IV Photonics, IEEE, Aug. 28, 2013, pp. 134-135.

\* cited by examiner

GERMANIUM-ON-SILICON LASER IN CMOS TECHNOLOGY

CROSS REFERENCE TO RELATED APPLICATION

This application is a divisional of U.S. patent application Ser. No. 15/555,639, filed Sep. 5, 2017, which claims priority from PCT/FR2015/050555, filed Mar. 6, 2015, the disclosures of which are incorporated by reference herein.

BACKGROUND

The present disclosure relates to a germanium laser that can be formed on silicon in a way compatible with the forming of CMOS integrated circuits.

DISCUSSION OF THE RELATED ART

A germanium-on-silicon laser is formed of a desired length of a waveguide comprising an N-type germanium strip surrounded by P-type and N-type silicon strips. The P-type and N-type silicon strips should be able to be connected to respective positive and negative potentials to perform a planar electric injection into the germanium. The laser may operate at a wavelength comprised within a wavelength range from 1.55 to 2.2 µm, particularly according to the germanium strain level.

The forming of a silicon-germanium-silicon waveguide will here essentially be described. It should be understood that, to form a laser, this waveguide will be longitudinally delimited at its opposite ends by reflective surfaces which may for example correspond to trenches to obtain an air-germanium interface. It may be preferred to deposit a thin silicon nitride layer, SiN, to form an air-SiN-germanium interface or form a Bragg mirror adapted to the emission wavelength of the laser which is desired to be formed. These various options enable to associate on a photonic chip the germanium laser with a passive waveguide made of silicon or SiN, noting that silicon is transparent in infrared at the wavelengths at which a germanium laser operates.

The silicon-germanium-silicon assembly forms a double heterostructure. The N-doped germanium is the active area of the laser. The two other semiconductors play the role of potential barriers which enable to inject and to confine in the germanium the carriers necessary for the generation of radiative recombinations. Typically, the germanium strip is N-type doped with a density in the range from 0.8 to $4.10^{19}$ atoms per $cm^3$.

There is a need for a germanium laser which can be manufactured by only using current CMOS integrated circuit technologies, and particularly CMOS integrated circuits on silicon where some at least of the transistors have strained germanium or silicon-germanium channel areas.

SUMMARY

Thus, an embodiment provides a method of forming a germanium waveguide comprising the steps of delimiting an area of a P-type silicon substrate with trenches, coating this area with a heavily-doped N-type germanium strip and with a first N-type doped silicon strip; and coating the entire structure with a silicon nitride layer.

According to an embodiment, the method comprises the step of defining in the silicon nitride contact openings on the sides of the first silicon strip covering the germanium strip.

According to an embodiment, the method comprises, after the forming of the trenches and the coating with germanium and silicon, a step of widening the openings in the substrate so that the germanium strip rests on a silicon base.

An embodiment provides a germanium waveguide comprising a P-type silicon substrate strip delimited by lateral trenches coated with a heavily-doped N-type germanium strip and with a first N-type doped silicon strip, the assembly being coated with a silicon nitride layer.

According to an embodiment, the trenches are widened in their portion penetrating into the silicon substrate, whereby the germanium strip rests on a second silicon strip of decreased width.

An embodiment provides a method of forming a germanium waveguide comprising the steps of forming in a silicon substrate a heavily-doped N-type germanium strip, forming on each side of the strip respectively P-type and N-type doped silicon strips, etching so that the germanium strip and adjacent portions of the silicon strips are raised with respect to the substrate surface, and coating the structure with a silicon nitride layer.

An embodiment provides a germanium waveguide comprising, on a silicon substrate, a heavily-doped N-type germanium strip, surrounded with respectively P-type and N-type doped silicon strips, the assembly being coated with a silicon nitride layer.

An embodiment provides a method of manufacturing a germanium waveguide comprising the steps of forming on a substrate coated with a germanium layer a heavily-doped N-type germanium strip, depositing on either side of the germanium strip respectively P-type and N-type doped silicon/germanium strips, and coating the upper surface of the germanium strip with a silicon nitride layer.

According to an embodiment, the heavily-doped N-type germanium strip is coated with a more lightly doped N-type germanium strip.

An embodiment provides a germanium waveguide comprising above a silicon substrate coated with a germanium layer a heavily-doped N-type germanium strip, this strip being surrounded with silicon/germanium strips.

According to an embodiment, the heavily-doped N-type germanium strip is coated with a more lightly doped N-type germanium strip.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
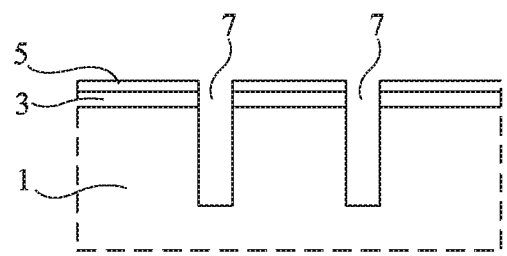
FIGS. 1A to 1D are simplified transverse cross-section views illustrating successive steps of the manufacturing of a first embodiment of a germanium laser.

The same elements have been designated with the same reference numerals in the different drawings and, further, the various drawings are not to scale. For clarity, only those elements which are useful to the understanding of the described embodiments have been shown and are detailed.

In the following description, when reference is made to terms qualifying the position and orientation such as "above", "under", "upper", "lower", etc., reference is made to the representation of the concerned elements in the drawings.

1. Planar Injection Laser

FIGS. 1A to 1D are simplified transverse cross-section views illustrating successive steps of the manufacturing of a first embodiment of a planar injection germanium laser.

As illustrated in FIG. 1A, it is started from a P-type silicon substrate 1, which may be a thin silicon-on-insulator layer (SOI). On this substrate 1, a thin N-type germanium layer 3 is deposited and then covered with a thin N-type silicon layer 5. It should be noted that layer 5 may be a polysilicon layer, the materials of layers 1 and 3 being monocrystalline. The waveguide is formed in the central portion of FIG. 1A delimited by trenches 7 which penetrate into substrate 1, and extends orthogonally to the plane of the drawing.

Figure 1B:
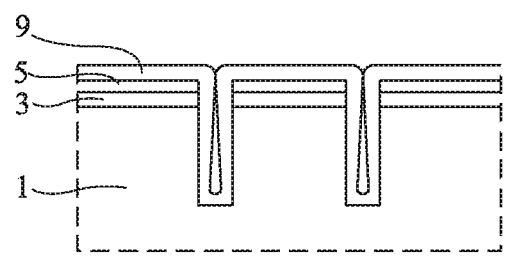

At a next step illustrated in FIG. 1B, a silicon nitride layer 9 is deposited. Conventionally, the silicon nitride layer is deposited by plasma-enhanced chemical vapor deposition (PECVD) at a temperature in the range from 300 to 700° C. The tensioning of the germanium is ensured by the fact that the silicon nitride layer (SiN) is placed under compressive strain on deposition thereof. This strain will relax and the nitride layer returns to a more stable state and stretches. As a result of this deformation, the layers located under the silicon nitride layer are under tensile strain. Preferably, the waveguide is oriented in the <100> crystallographic direction of the germanium. Silicon nitride layer 9 covers the structure and, preferably, penetrates into trenches 7. Before the deposition of the silicon nitride layer, it is possible to deposit a silicon oxide layer having a thickness of some ten nanometers to improve the bonding and to passivate the free surfaces of the semiconductors.

Figure 1C:
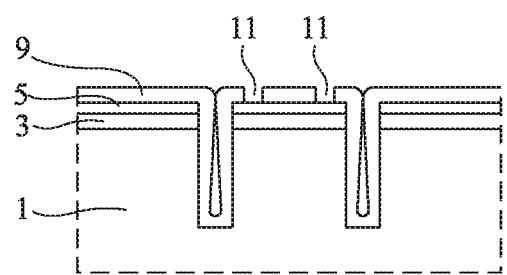

At a next step illustrated in FIG. 1C, openings 11 are formed in the silicon nitride layer to enable to form a contact on underlying silicon layer 5. As shown, openings 11 are preferably arranged on either side of the guide width to avoid relaxing the strain caused by silicon nitride layer 9 in the underlying layers.

Figure 1D:
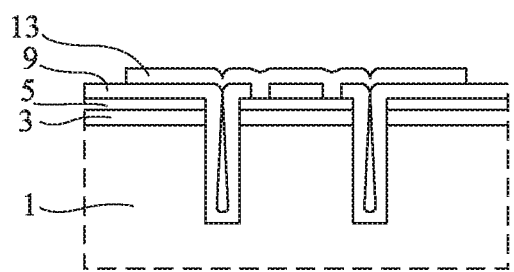

After this, as illustrated in FIG. 1D, a layer of a conductive material 13 is deposited to form contacts on N-type silicon layer 5. Further, an electrical contact, not shown, is conventionally created on P-type silicon substrate 1. This contact may be laterally transferred to an area close to the waveguide. A metal strip may for example be deposited parallel to the guide in an area etched down to a depth close to some ten micrometers to form the contact on substrate 1.

According to the choice of materials used and to the geometry of the structure (guide width, thickness of the layers, depth of the trenches, position of the openings) and to the characteristics of the silicon nitride layer deposited by PECVD, the uniaxial deformation in the germanium induced by the silicon nitride layer may reach a level in the range from 0.55 to 0.87%. The disclosed structure is adaptable to different type of stackings of materials.

The strain is homogeneously applied along the entire width of the guide, even for significant thicknesses of the germanium layer. This provides an active medium having a length of several micrometers, and accordingly a significant gain per unit length for the laser.

The waveguide may have a width in the range from 4 to 6 µm, according to the desired optical properties, while ensuring a good transfer of the strain.

The thickness of N-type doped germanium layer 3 is in the range from 250 to 300 nm (close to $\lambda/2n$, where $\lambda$ is the emission wavelength of the laser and n is the refraction index of germanium). Such a thickness provides a good guiding of the light in near infrared. Layer 5, which is used as an electric injector, should be selected with a thickness sufficient to obtain an electric contact of good quality, but not too thick, to avoid for this layer to absorb the strain transmitted by the SiN layer.

Based on the above-discussed imperatives, digital finite element simulations of the mechanical behavior of the structure may be performed to optimize the different parameters of the topology of the waveguide (trench depth, guide width, positioning of the openings). The transfer of the strain in the structure may be simulated from the value of the initial strain of the silicon nitride layer deposited across a 300-nm thickness. The value of the initial hydrostatic strain of the SiN film in compressive mode is −4.5 GPa (in practice, −1.8 GPa is obtained in the plane of the layer at equilibrium). The strain level may be modified by modifying the silicon nitride layer deposition parameters. The uniaxial deformation values only take into account the effect of the SiN layer. According to the conditions of deposition of the germanium on silicon layer, it is possible to obtain an initial residual strain associated with the thermal expansion coefficient difference. This deformation, which is in the range from 0.15 to 0.25%, may add to the total deformation that can be transferred by the silicon nitride layer.

The silicon nitride layer deposited in the bottom of the trenches forms a compressive strain pocket. Such a pocket adversely affects the obtaining of the laser effect in the germanium. An etching of the trenches down to a 1.5-µm depth provides an optimal result to limit this effect, and this, for different guide widths which may range up to 5 µm.

Tests and simulations have shown that the dimensions of the elements of the waveguide should preferably be within the following ranges:
  guide width: from 4 to 6 µm,
  thickness of germanium layer 3: from 200 to 500 nm,
  thickness of injector layer 5: from 100 to 250 nm,
  thickness of nitride layer 9: from 300 to 500 nm,
  trench width: from 0.5 to 1 µm,
  trench depth: from 1 to 1.5 µm,
  width of the openings: from 200 to 500 nm,
  distance from the openings to the edges: from 200 to 500 nm.

FIGS. 2A to 2E are transverse cross-section views illustrating successive steps of the manufacturing of a variation of the structure of FIG. 1D.

Figure 2A:
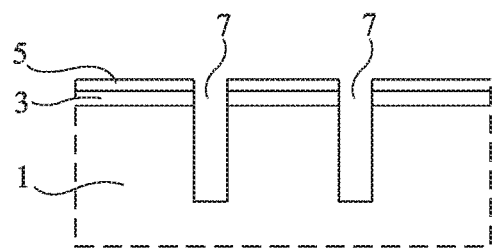
FIGS. 2A to 2E are simplified transverse cross-section views illustrating successive steps of the manufacturing of a variation of the first embodiment of a germanium laser.

FIG. 2A shows the structure already described in relation with FIG. 1A.

Figure 2B:
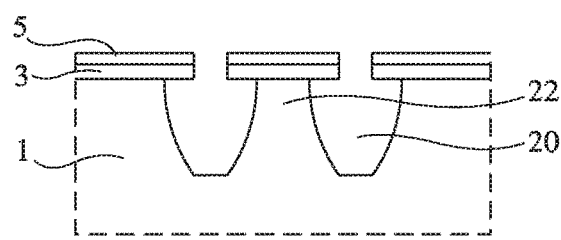

At a step illustrated in FIG. 2B, a selective anisotropic etching of P-type silicon 1 is carried out so that trenches 7 widen under germanium layer 3 to form bowl-shaped openings 20. Thus, under germanium 3, only a narrowed portion or base 22 of silicon substrate 1 remains in place. Of course, base 22 extends in a strip orthogonal to the plane of the drawings.

Figure 2C:
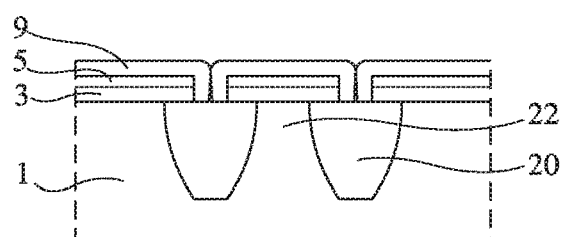
Figure 2D:
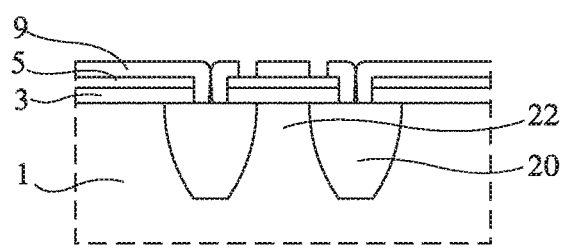
Figure 2E:
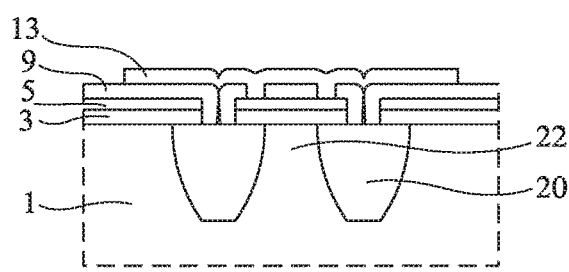

The next steps illustrated in FIGS. 2C to 2E are respectively identical to the steps described in relation with FIGS. 1B to 1D.

Thus, in the structure of FIG. 1D, silicon substrate 1 extends under the entire portion of germanium layer 3 while in the structure of FIG. 2E, the germanium layer portion only partly rests on a silicon base 22. The disengaging of the germanium layer allows a deformation of greater amplitude and enables to obtain a more efficient strain transfer.

The variation of FIGS. 2A to 2E, where the germanium is suspended on a base, enables to obtain the following advantages over the case of FIGS. 1A to 1D:
- greater strain in the structure,
- confinement of the optical mode at the center of the structure, and
- confinement of the carriers at the center of the structure during the electric injection.

For a guide having a 5 µm thickness without the base, a uniaxial tensile deformation of 0.5% can be obtained in the germanium. The underetching enables to amplify this value up to 0.75%. The thinner the base, the more significant the deformation that can be achieved in the structure will be, but the maximum is located at the interface between the SiN layer and the semiconductor for the electric injection. This effect is due to the bend of the structure. A good tradeoff is given for a ratio from 0.5 to 0.7, for example, 0.6, between the width of the waveguide and the size of the base.

Tests and simulations have shown that the dimensions of the elements of the waveguide could preferably be within the following ranges:
- guide width: from 3 to 5 µm,
- base height: from 1 to 1.5 µm,
- base width: from 0.55 to 0.65 times the width of the germanium strip,
- width of the openings: from 200 to 500 nm,
- distance from the openings to the edges: from 200 to 500 nm.

2. First Example of Lateral Injection Laser

FIGS. 3A to 3G are simplified transverse cross-section views illustrating successive steps of the manufacturing of a second embodiment of a lateral injection germanium laser.

Figure 3A:
FIGS. 3A to 3G are simplified transverse cross-section views illustrating successive steps of the manufacturing of a second embodiment of a germanium laser.

As illustrated in FIG. 3A, it is started from a silicon substrate 1, possibly of SOI type. This substrate is preferably lightly doped, and practically insulating, or P-type doped.

Figure 3B:
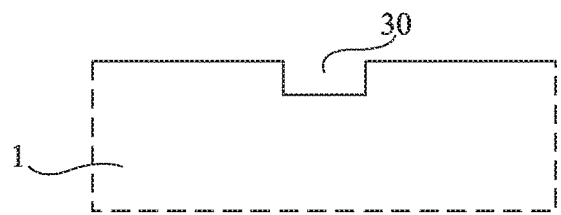

At the step illustrated in FIG. 3B, a groove 30 has been formed in the substrate.

Figure 3C:
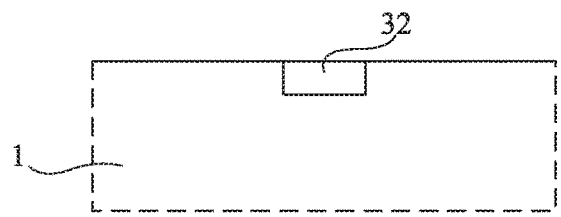

At the step illustrated in FIG. 3C, the groove has been filled by local epitaxy of a heavily-doped N-type germanium strip 32.

Figure 3D:
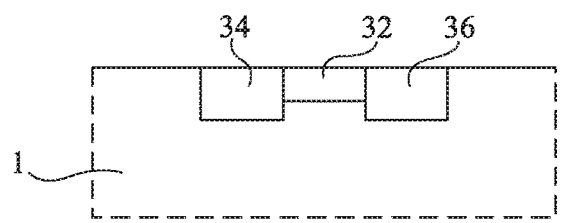

At the step illustrated in FIG. 3D, one has formed in substrate 1, on either side of germanium strip 32, parallel strips 34 and 36 doped by implantation, respectively of type P and of type N.

Figure 3E:
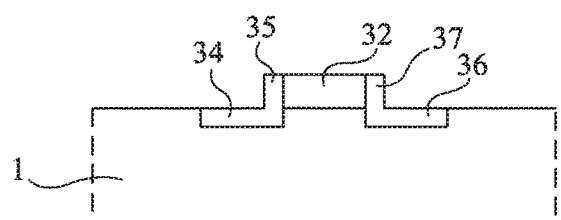

At the step illustrated in FIG. 3E, the upper surface of germanium strip 32 and a neighboring portion of parallel doped silicon strips 34 and 36 has been masked. After this, an etching has been carried out to form a raised area comprising an upper portion 35 of strip 34 and an upper portion 37 of strip 36 which surround germanium strip 32. The recessed portions of strips 34 and 36 are offset from the sides of strip 32 and may, for example, example, have an upper surface coplanar with the substrate 1 (also recessed by the etching). The upper surface of the recessed strips and substrate may, for example, be substantially coplanar with the lower surface of the strip 32. The strips on either side of the strip 32 have an L shape in cross section with one leg formed by the recessed portions 34 and a perpendicular leg formed by the portion 35 and 37.

Figure 3F:
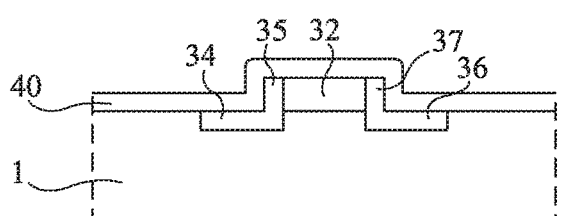

At the step illustrated in FIG. 3F, the entire structure is coated with a silicon nitride layer 40 which generates the desired strain effect as previously described. It should be noted that, in this embodiment, the nitride is directly deposited on the germanium and thus that the strain is directly applied thereto and is thus even more efficient than in the previously-described embodiments of planar injection guides. Before the deposition of the silicon nitride layer, it is possible to deposit a silicon oxide layer having a thickness of some ten nanometers to improve the bonding and to passivate the free surfaces of the semiconductors.

Figure 3G:
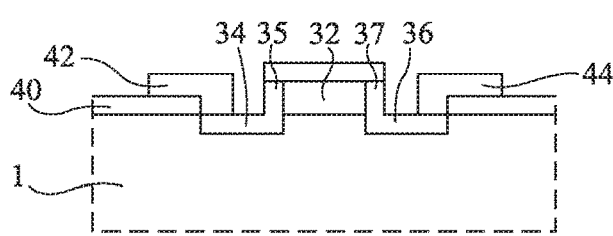

At the step illustrated in FIG. 3G, the nitride layer has been only maintained on the upper surface of the guide and outside of the structure. After this, metallizations 42 and 44 in contact, respectively, with silicon strips 34 and 36 have been formed. Metallization 42 is intended to be connected, in operation, to a positive potential and metallization 44 is intended to be connected, in operation, to a negative or zero potential.

The lateral doped silicon layers enable to transfer the contacting area laterally with respect to the waveguide. The metal contacts have no influence upon the transfer of the strain into the germanium via the silicon nitride layer. This also enables to avoid for the optical mode to be disturbed by the metal, and to avoid for a possible heating of the current supply metal conductors to affect the active area of the waveguide.

For a waveguide having a 5-µm width with an active area having a 4.6-µm width, the deformation reaches a 0.5% level. The results are close to a planar injection guide. However, when the guide width is decreased to 2 µm, the ratio between the width of the guide and that of the SiN layer is modified, and the uniaxial deformation may reach a level of 1.3%.

Tests and simulations have shown that the dimensions of the waveguide elements could preferably be within the following ranges:
- guide width: from 1.6 to 3 µm,
- width of the Ge layer: from 1.5 to 2.5 µm,
- width of the Si layers: 2×200 nm,
- guide height: from 300 nm to 1 µm,
- width of the SiN layer: from 300 to 500 nm.

3. Second Example of Lateral Injection Laser

FIGS. 4A to 4F are simplified transverse cross-section views illustrating successive steps of the manufacturing of a first variation of a third embodiment of a lateral injection germanium laser.

Figure 4A:
FIGS. 4A to 4F are simplified transverse cross-section views illustrating successive steps of the manufacturing of a first variation of a third embodiment of a germanium laser.

As illustrated in FIG. 4A, it is started from a silicon substrate 1, possibly of SOI type, coated with a germanium layer 50. Germanium layer 50 comprises a heavily-doped N-type central area 51. This is obtained by successive epitaxies or by implantation.

Figure 4B:
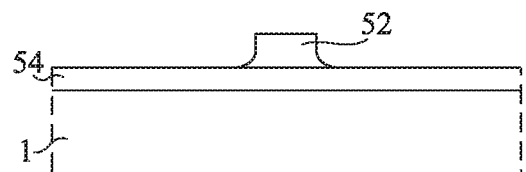

At the step illustrated in FIG. 4B, an etching is performed to delimit a strip 52 of the heavily-doped germanium resting on a more lightly doped germanium layer 54. The upper heavily-doped germanium portion is removed.

Figure 4C:
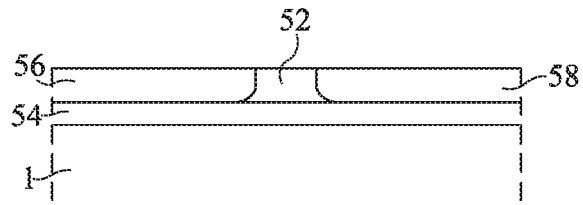

At the step illustrated in FIG. 4C, a local epitaxy of strained $Si_xGe_{1-x}$ (x being a number smaller than 1) on germanium 54, is carried out on either side of strip 52. $Si_xGe_{1-x}$ strips extending on either side of heavily-doped N-type central germanium strip 52 are thus obtained. These $Si_xGe_{1-x}$ strips are doped, for example, by implantation, to form respectively P-type and N-type doped silicon/germanium strips 56 and 58.

Figure 4D:
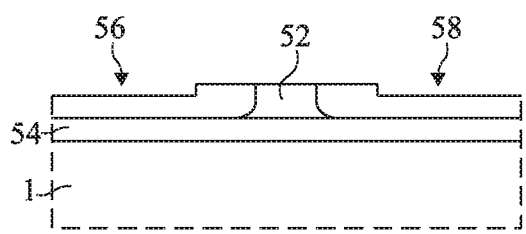

At the step illustrated in FIG. 4D, portions of each of silicon/germanium strips 56 and 58 which are not adjacent to germanium strip 52 are etched to decrease their thickness. The etching depth is approximately ⅓ of the thickness of SiGe layers 56 and 58 (that is, from 20 to 100 nm, for SiGe layers from 50 to 300 nm). The lateral dimension of the SiGe layers is from 1 to 2 µm. Thus, the total width of the guide is from 1.05-1.3 µm to 2.05-2.3 µm, according to the width of the central germanium layer.

Figure 4E:
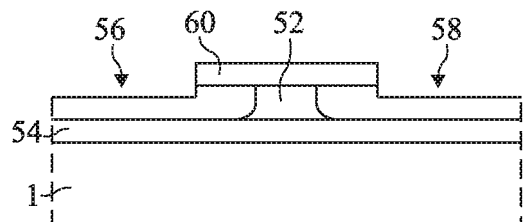

At the step illustrated in FIG. 4E, one has formed on the central portion of the guide, that is, on germanium strip 52 and on the raised portions of strips 56, 58, a strained SiN layer 60 to enhance the deformation at the center of the structure. The SiN layer is directly in contact with the germanium, which provides an optimized strain transfer.

Figure 4F:
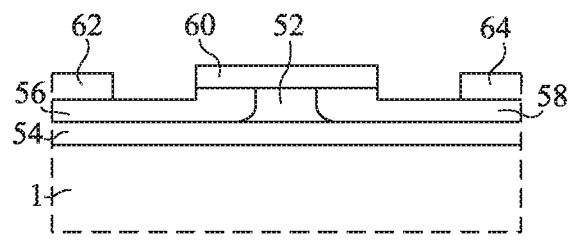

After this, as illustrated in FIG. 4F, electric contacts 62, 64 are formed on SiGe strips 56, 58.

FIGS. 5A to 5E are simplified transverse cross-section views illustrating successive steps of the manufacturing of a second variation of a third embodiment of a lateral injection germanium laser.

Figure 5A:
FIGS. 5A to 5E are simplified transverse cross-section views illustrating successive steps of the manufacturing of a second variation of a third embodiment of a germanium laser.

FIG. 5A is identical to FIG. 4A.

Figure 5B:
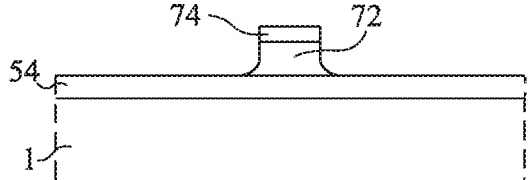

At the step illustrated in FIG. 5B, an etching is performed to delimit a strip 72 of the heavily-doped germanium resting on a more lightly doped germanium layer 54. The upper lightly-doped germanium portion is maintained in place and forms a strip 74 on strip 72.

Figure 5C:
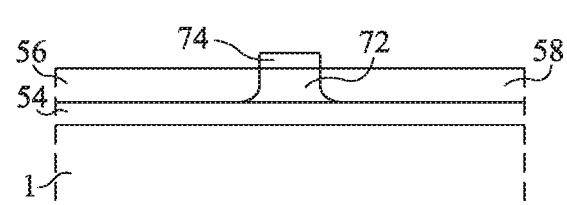

At the step illustrated in FIG. 5C, a local epitaxy of strained $Si_xGe_{1-x}$ (x being a number smaller than 1) on germanium 54, is carried out on either side of strip 72. The epitaxy is interrupted at the level of the limit between strips 72 and 74 (so that, for example, strips 56, 58 do not reach and make contact with the strip 74). $Si_xGe_{1-x}$ strips extending on either side of heavily-doped N-type central germanium strip 72 are thus obtained. These $Si_xGe_{1-x}$ strips are doped, for example, by implantation, to form respectively P-type and N-type doped silicon/germanium strips 56 and 58.

Figure 5D:
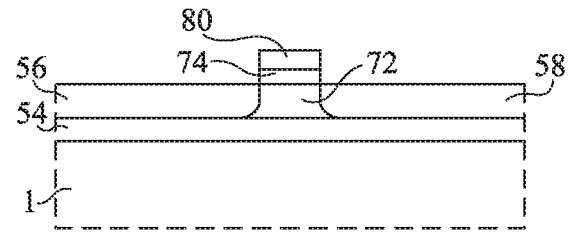

At the step illustrated in FIG. 5D, one has formed on the central portion of the guide, that is, on germanium strip 74, a strained SiN layer 80 to enhance the deformation at the center of the structure. The SiN layer is directly in contact with the germanium, which provides an optimized strain transfer.

Figure 5E:
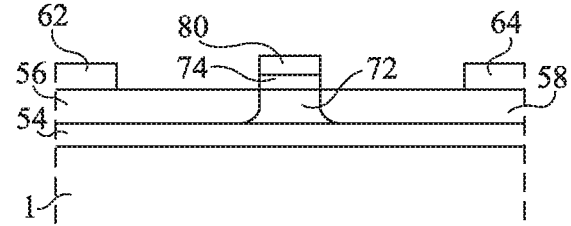

After this, as illustrated in FIG. 5E, electric contacts 62, 64 are formed on SiGe strips 56, 58.

The structures of FIGS. 4F and 5E use lateral epitaxial $Si_xGe_{1-x}$ strips 56 and 58 strained and doped around the central guide or band. Such epitaxial strips enable to:

1) create a local tensile strain against the germanium band in the N-type doped area, 2) performing the electric injection of the carriers into the N doped germanium, by taking advantage of the discontinuities of the energy bands between the Ge and the SiGe for the confinement of the carriers.

The tensile strain in the SiGe layer will transfer by laterally pulling the germanium layer. The strain depends on the silicon concentration in the $Si_xGe_{1-x}$ layer. It is due to the mesh parameter difference between the silicon and the germanium.

Regarding the strain transfer, the critical parameter is the thickness of the $Si_xGe_{1-x}$ layer which can be grown by epitaxy according to its composition. The strain obtained in $Si_xGe_{1-x}$ layer is proportional to the product of the composition by the relative mesh parameter difference between the silicon and the germanium. The larger the silicon concentration, the more the $Si_xGe_{1-x}$ layer will be strained. As a counterpart, however, the maximum thickness which can be obtained decreases. Typically, the critical thicknesses, emax, and the biaxial strains, Ell, of the $Si_xGe_{1-x}$ layers are:

$Si_{0.4}Ge_{0.6}$: emax=50-70 nm, $\varepsilon//=1.6\%$
$Si_{0.3}Ge_{0.7}$: emax=100-150 nm, $\varepsilon//=1.2\%$
$Si_{0.2}Ge_{0.8}$: emax=250-300 nm, $\varepsilon//=0.8\%$ The thickness of the active germanium layer should be identical to that of the $Si_xGe_{1-x}$ layer for an optimal strain transfer. The applicants have studied the strain transfer for these three cases and have also considered the effect of the addition of a strained SiN layer to amplify the transferred strain.

$Si_{0.2}Ge_{0.8}$

An active germanium layer of 250×250 nm is considered. The initial strain in the $Si_{0.2}Ge_{0.8}$ layer is $\varepsilon//=0.8\%$. The average uniaxial deformation in the active germanium area is 0.5%, the addition of a SiN layer enables to amplify the average uniaxial deformation in germanium up to a value of 0.6%.

$Si_{0.3}Ge_{0.7}$

An active germanium layer of 125×125 nm is considered. The initial strain in the $Si_{0.3}Ge_{0.7}$ layer is $\varepsilon//=1.2\%$. The average uniaxial deformation in the active germanium area is 0.9%, by using $Si_{0.3}Ge_{0.7}$ layers. The addition of a SiN layer enables to increase the average uniaxial deformation up to 0.98%.

$Si_{0.4}Ge_{0.6}$

An active germanium layer of 50×50 nm is considered. The average uniaxial strain in the active germanium area in the $Si_{0.4}Ge_{0.6}$ layer is $\varepsilon//=1.6\%$. The average uniaxial deformation in the active germanium area is 1.13%, by using $Si_{0.4}Ge_{0.6}$ layers. The addition of a SiN layer enables to obtain an average uniaxial deformation of 1.42%.

Various embodiments with different variations have been described hereabove. It should be noted that those skilled in the art may combine various elements of these various embodiments and variations without showing any inventive step. It should be understood that, for the sake of brevity, certain explanations and numerical indications given for certain embodiments have not been repeated for other embodiments.

Further, each of the materials described as an example may be replaced with a material having the same properties and the same function in the devices and methods described hereabove as an example only.

The invention claimed is:

1. A method of forming a germanium waveguide, comprising:
    forming a N-type doped germanium strip in a silicon substrate;
    forming a P-type doped silicon strip on a first side of the N-type doped germanium strip;
    forming an N-type doped silicon strip on a second side of the N-type doped germanium strip opposite said first side;
    etching so that the N-type doped germanium strip and adjacent portions of the P-type and N-type doped silicon strips are raised with respect to a substrate surface; and
    coating the N-type doped germanium strip and the adjacent portions as well as a structure adjacent thereto with a silicon nitride layer.

2. The method of claim 1, wherein etching comprises performing an etch which:
    selectively removes a portion of the P-type doped silicon strip and an adjacent portion of the silicon substrate to leave the adjacent portion of the P-type doped silicon strip raised above the substrate surface and leave a recessed portion of the P-type doped silicon strip coplanar with the substrate surface; and selectively removes a portion of the N-type doped silicon strip and an adjacent portion of the silicon substrate to leave the adjacent portion of the N-type doped silicon strip raised above the substrate surface and leave a recessed portion of the N-type doped silicon strip coplanar with the substrate surface.

3. The method of claim 2, wherein a bottom of the N-type doped germanium strip is coplanar with the substrate surface.

4. The method of claim 2, wherein coating comprises depositing the silicon nitride layer on the substrate surface, the recessed portion of the P-type doped silicon strip and the recessed portion of the N-type doped silicon strip.

5. The method of claim 4, further comprising:
forming a first opening extending through the silicon nitride layer to expose an upper surface of the recessed portion of the P-type doped silicon strip; and
forming a second opening extending through the silicon nitride layer to expose an upper surface of the recessed portion of the N-type doped silicon strip.

6. The method of claim 5, further comprising:
forming a first metal contact in said first opening to electrically connect to the recessed portion of the P-type doped silicon strip; and
forming a second metal contact in said second opening to electrically connect to the recessed portion of the N-type doped silicon strip.

7. The method of claim 6, wherein the first metal contact and second metal contact each extend partially on a top surface of the silicon nitride layer outside of the first opening and second opening, respectively.

8. The method of claim 6, wherein forming the first and second metal contacts comprises leaving portions of the first legs of the P-type and N-type doped silicon strips in said first and second openings, respectively, uncovered by the first and second metal contacts, respectively.

9. A germanium waveguide, comprising:
a silicon substrate,
a N-type doped germanium strip on said silicon substrate;
a P-type doped silicon strip on the silicon substrate adjacent a first side of the N-type doped germanium strip;
an N-type doped silicon strip on the silicon substrate adjacent a second side of the N-type doped germanium strip opposite said first side; and
a silicon nitride layer coating the N-type doped germanium strip and the silicon strips.

10. The waveguide of claim 9:
wherein the P-type doped silicon strip has a shape in a cross-section extending perpendicularly through the silicon substrate of an L with a first leg extending parallel to and coplanar with a top surface of the silicon substrate and a second leg extending perpendicular to the coplanar top surface of the silicon substrate and positioned in contact with the first side of the N-type doped germanium strip; and
wherein the N-type doped silicon strip has a shape in the cross-section extending perpendicularly through the silicon substrate of an L with a first leg extending parallel to and coplanar with the top surface of the silicon substrate and a second leg extending perpendicular to the coplanar top surface of the silicon substrate and positioned in contact with the second side of the N-type doped germanium strip.

11. The waveguide of claim 10, wherein a top surface of each first leg is coplanar with the top surface of the silicon substrate.

12. The waveguide of claim 10, wherein the silicon nitride layer coats a top surface of each first leg.

13. The waveguide of claim 12, further comprising:
a first opening extending through the silicon nitride layer to an upper surface of the first leg of the P-type doped silicon strip; and
a second opening extending through the silicon nitride layer to an upper surface of the first leg of the N-type doped silicon strip.

14. The waveguide of claim 13, further comprising:
a first metal contact in said first opening to electrically connect to the first leg of the P-type doped silicon strip; and
a second metal contact in said second opening to electrically connect to the first leg of the N-type doped silicon strip.

15. The waveguide of claim 14, wherein the first metal contact and second metal contact each extend partially on a top surface of the silicon nitride layer outside of the first opening and second opening, respectively.

16. The waveguide of claim 14, wherein portions of the first legs of the P-type and N-type doped silicon strips in said first and second openings, respectively, are not covered by the first and second metal contacts, respectively.

* * * * *